United States Patent
Sikina et al.

(10) Patent No.: US 11,158,955 B2
(45) Date of Patent: Oct. 26, 2021

(54) LOW PROFILE PHASED ARRAY

(71) Applicant: RAYTHEON COMPANY, Waltham, MA (US)

(72) Inventors: Thomas V. Sikina, Acton, MA (US); John P. Haven, Lowell, MA (US); James E. Benedict, Lowell, MA (US); Jonathan E. Nufio-Molina, Methuen, MA (US); Andrew R. Southworth, Lowell, MA (US)

(73) Assignee: RAYTHEON COMPANY, Waltham, MA (US)

( * ) Notice: Subject to any disclaimer, the term of this patent is extended or adjusted under 35 U.S.C. 154(b) by 249 days.

(21) Appl. No.: 16/183,116

(22) Filed: Nov. 7, 2018

(65) Prior Publication Data

US 2019/0148828 A1    May 16, 2019

Related U.S. Application Data

(60) Provisional application No. 62/584,300, filed on Nov. 10, 2017, provisional application No. 62/584,264, filed on Nov. 10, 2017.

(51) Int. Cl.
*H01Q 1/52* (2006.01)
*H01Q 21/00* (2006.01)
(Continued)

(52) U.S. Cl.
CPC ......... *H01Q 21/0087* (2013.01); *H01P 1/047* (2013.01); *H01P 5/028* (2013.01); *H01Q 1/42* (2013.01); *H01Q 1/44* (2013.01); *H01Q 1/523* (2013.01); *H01Q 1/526* (2013.01); *H01Q 13/10* (2013.01); *H01Q 13/106* (2013.01); *H01Q 13/18* (2013.01); *H01Q 17/001* (2013.01); *H01Q 17/008* (2013.01); *H01Q 21/0075* (2013.01); *H05K 1/0219* (2013.01);
(Continued)

(58) Field of Classification Search
None
See application file for complete search history.

(56) References Cited

U.S. PATENT DOCUMENTS

| 4,875,087 A | 10/1989 | Miyauchi et al. |
| 5,401,175 A | 3/1995 | Guimond et al. |

(Continued)

FOREIGN PATENT DOCUMENTS

| CN | 201845850 U | 5/2011 |
| CN | 106936521 A | 7/2017 |

(Continued)

OTHER PUBLICATIONS

International Search Report and Written Opinion in application No. PCT/US2018/059636 dated Mar. 4, 2019.
(Continued)

*Primary Examiner* — Trinh V Dinh
(74) *Attorney, Agent, or Firm* — Lando & Anastasi, LLP

(57) ABSTRACT

A low profile array (LPA) includes an antenna element array layer having at least one Faraday wall, and a beamformer circuit layer coupled to the antenna element array layer. The beamformer circuit layer has at least one Faraday wall. The Faraday walls extends between ground planes associated with at least one of the antenna element array layer and the beamformer circuit layer.

10 Claims, 17 Drawing Sheets

(51) Int. Cl.
*H01P 1/04* (2006.01)
*H01Q 13/10* (2006.01)
*H01Q 13/18* (2006.01)
*H05K 1/02* (2006.01)
*H05K 3/40* (2006.01)
*H01P 5/02* (2006.01)
*H01Q 17/00* (2006.01)
*H01Q 1/42* (2006.01)
*H01Q 1/44* (2006.01)
*B33Y 10/00* (2015.01)
*B33Y 70/00* (2020.01)
*B33Y 80/00* (2015.01)

(52) U.S. Cl.
CPC ............ *H05K 3/4038* (2013.01); *B33Y 10/00* (2014.12); *B33Y 70/00* (2014.12); *B33Y 80/00* (2014.12)

(56) References Cited

U.S. PATENT DOCUMENTS

| | | |
|---|---|---|
| 5,426,399 A | 6/1995 | Matsubayashi et al. |
| 5,828,555 A | 10/1998 | Itoh |
| 5,857,858 A | 1/1999 | Gorowitz et al. |
| 6,000,120 A | 12/1999 | Arledge et al. |
| 6,137,453 A | 10/2000 | Wang et al. |
| 6,353,189 B1 | 3/2002 | Shimada et al. |
| 6,400,234 B1 | 6/2002 | Ohhashi et al. |
| 6,486,755 B2 | 11/2002 | Aruga |
| 6,651,322 B1 | 11/2003 | Currie |
| 6,674,347 B1 | 1/2004 | Maruhashi et al. |
| 6,747,217 B1 | 6/2004 | Jochym et al. |
| 6,937,120 B2 | 8/2005 | Fisher et al. |
| 7,038,622 B2 | 5/2006 | Schmidt et al. |
| 7,405,477 B1 | 7/2008 | Tao et al. |
| 7,443,279 B2 | 10/2008 | Yagisawa et al. |
| 8,749,434 B2 | 6/2014 | Han et al. |
| 8,773,323 B1 * | 7/2014 | Manry, Jr. ............. H01Q 21/28 343/841 |
| 10,505,255 B2 * | 12/2019 | Baheti .................... H01Q 1/521 |
| 2003/0067410 A1 | 4/2003 | Puzella et al. |
| 2003/0188889 A1 | 10/2003 | Straub et al. |
| 2003/0201851 A1 | 10/2003 | Yoshida et al. |
| 2006/0044083 A1 | 3/2006 | Kuzmenka |
| 2006/0214744 A1 | 9/2006 | Margomenos |
| 2009/0000804 A1 | 1/2009 | Kobayashi et al. |
| 2010/0182105 A1 | 7/2010 | Hein et al. |
| 2010/0206617 A1 | 8/2010 | Johnson et al. |
| 2010/0254094 A1 | 10/2010 | Ohhira |
| 2013/0009729 A1 | 1/2013 | Kim |
| 2013/0154773 A1 | 6/2013 | Siprak |
| 2015/0189754 A1 | 7/2015 | Bohra et al. |
| 2015/0323576 A1 | 11/2015 | Bulja et al. |
| 2016/0079646 A1 | 3/2016 | Ichige |
| 2016/0172741 A1 | 6/2016 | Panat et al. |
| 2017/0117620 A1 | 4/2017 | Lapushin |
| 2018/0086628 A1 | 3/2018 | Vossough et al. |
| 2019/0148807 A1 * | 5/2019 | Sikina ..................... H01P 3/085 333/238 |
| 2019/0150271 A1 * | 5/2019 | Azadzoi ............... H05K 1/0251 333/238 |
| 2019/0269007 A1 * | 8/2019 | Sikina .................. H05K 1/0221 |
| 2020/0028257 A1 * | 1/2020 | Benedict .................. H01Q 1/36 |

FOREIGN PATENT DOCUMENTS

| | | |
|---|---|---|
| CN | 206742473 U | 12/2017 |
| EP | 1202377 A2 | 5/2002 |
| EP | 1473979 A1 | 11/2004 |
| GB | 2322237 A | 8/1998 |
| JP | 2013034184 A | 2/2013 |
| JP | 2015185550 A | 10/2015 |
| KR | 10-2002-0041771 A | 6/2002 |
| KR | 10-2005-0074517 A | 7/2005 |

OTHER PUBLICATIONS

Farhan Shafique et al. "Laser machining of microvias and trenches for substrate integrated waveguides in LTCC technology", Proceedings of the 39th European Microwave Conference (2009), pp. 272-275.
Deslandes et al. "Integrated Microstrip and Rectangular Waveguide in Planar Form", IEEE Microwave and Wireless Components Letters (2001) vol. 11, No. 2, pp. 68-70.
International Search Report and Written Opinion in application No. PCT/US2018/059625 dated Mar. 4, 2019.
Leib et al. "An ultra-wideband vertical transition from microstrip to stripline in PCB technology", Proceedings of 2010 IEEE International Conference on Ultra-Wideband (2010), p. 1-4.
International Search Report and Written Opinion in application No. PCT/US2018/059240 dated Mar. 4, 2019.
Mukherjee et al. "Broadband Substrate Integrated Waveguide Cavity-Backed Bow-Tie Slot Antenna", IEEE Antennas and Wireless Propagation Letters (2014) vol. 13, p. 1152-1155.
Liu et al. "Broadband Circularly Polarized Antenna With High Gain for Ku-band Applications", IEEE Conference Proceedings (2017), p. 1-2.
Kim et al. "Slot-Coupled Circularly Polarized Array Antenna With Substrate-Integrated Waveguide Cavity for Parallel-Plate-Mode Suppression", IEEE Transactions on Antennas and Propagation (2017) vol. 65, No. 8, p. 3999-4006.
Luo et al. "Antenna Array Elements for Ka-band Satellite Communication on the Move", Loughborough Antennas & Propagation Conference (2013), p. 135-139.
Beeresha et al. "Embedded Microstrip Line to Stripline Vertical Transition Using LTCC Technique", International Journal of Research in Engineering and Technology (2015) vol. 4, Issue 12, pp. 30-34.
Shan et al. "A Compact Broadband Stripline-fed Slot Antenna for Array Application", IEEE International Workshop on Antenna Technology (2005), pp. 555-558.
International Search Report and Written Opinion in application No. PCT/US2018/059602 dated Apr. 18, 2019.
Hong et al. "Grid Assembly-Free 60-GHz Antenna Module Embedded in FR-4 Transceiver Carrier Board", IEEE Transactions on Antennas and Propagation (2013) vol. 61, No. 4, pp. 1573-1580.
Invitation to Pay Additional Fees in application No. PCT/US2018/059410 dated Apr. 23, 2019.
International Search Report and Written Opinion in application No. PCT/US2018/059841 dated Mar. 4, 2019.
Sitaraman et al. "Modeling, Design and Demonstration of Integrated Electromagnetic Shielding for Miniaturized RF SOP Glass Packages", Electronic Components & Technology Conference (2015), p. 1956-1960.
Bailey, M. "General Layout Guidelines for RF and Mixed-Signal PCBs", Maxim Integrated (2011), pp. 1-10. Retrieved from URL: «https://pdfserv.maximintegrated.com/en/an/AN5100.pdf».
International Search Report in application No. PCT/US2019/019851 dated May 29, 2019.
Jung et al. "Inkjet-printed resistors with a wide resistance range for printed read-only memory applications", Organic Electronics (2013) vol. 14, pp. 699-702.
Kim et al. "Fabrication of Fully Inkjet-Printed Vias and SIW Structures on Thick Polymer Substrates", IEEE Transactions on Components, Packaging and Manufacturing Technology (2016) vol. 6, No. 3, pp. 486-496.
International Search Report and Written Opinion in application No. PCT/US2019/019847 dated May 29, 2019.
Kangasvieri et al. "An Ultra-Wideband BGA-Via Transition for High-Speed Digital and Millimeter-Wave Packaging Applications", IEEE (2007), pp. 1637-1640.

* cited by examiner

| Function | Material | Height (mils) | SubAssy (mils) |
|---|---|---|---|
| Active Comonent Microstrip | Copper | 0.7 | |
| Microstrip substrate | Taconic RF-35 | 5.0 | |
| Microstrip Ground | Copper | 0.7 | 6.4 |
| DC-logic substrate (x2) | FR-4 | 8.0 | |
| DC-logic trace (x2) | Copper | 1.4 | |
| DC-Logic Ground (x3) | Copper | 1.4 | 10.8 |
| Beamformer (45) ground | Copper | 0.7 | |
| Bfmr (45) substrate | Taconic RF-35 | 5.0 | |
| Bfmr (45) trace | Copper | 0.7 | |
| Bfmr (45) substrate | Taconic RF-35 | 5.0 | |
| Bfmr (±45) ground | Copper | 0.7 | 12.1 |
| Radiator Feed ground | Copper | 0.7 | |
| Radiator Feed substrate | Taconic RF-35 | 10.0 | |
| Radiator Feed ground | Copper | 0.7 | |
| Radiator substrate | Taconic RF-35 | 5.0 | |
| Radiator ground | Copper | 0.7 | 17.1 |
| | | Total | 46.4 |

LOW PROFILE PHASED ARRAY

CROSS-REFERENCE TO RELATED APPLICATIONS

This application claims priority to U.S. Provisional Patent Application No. 62/584,300 filed Nov. 10, 2017, entitled LOW PROFILE PHASED ARRAY and to U.S. Provisional Patent Application No. 62/584,264 filed Nov. 10, 2017, entitled ADDITIVE MANUFACTURING TECHNOLOGY (AMT) LOW PROFILE RADIATOR, which are both incorporated by reference herein in their entirety.

GOVERNMENT RIGHTS

Not applicable.

BACKGROUND

As is known in the art, radars can include phased arrays to transmit and receive signals. Conventional Printed Circuit Board (PCB) methods may not yield an effective approach providing low profile arrays. Existing processes have feature sizes and substrate thickness limits that may preclude compliance with desired thicknesses. Current array designs employ a standard PCB process which relies on multiple process steps, expensive materials, and slow cycle turnaround time. Multiple process steps drive high costs and slow turnaround times. As assemblies are moved from one process to the next (e.g., lamination, conductive via backfill) labor cost is added to the overall assembly. The added labor cost adds cycle time which leads to long build times which extend any troubleshooting phase.

SUMMARY

In embodiments, a low profile array (LPA) includes a phased array that utilizes additive manufacturing technology (AMT). LPA embodiments can include phased array functionality well-suited for space-based radars. LPA embodiments may be configured to be foldable for allowing significantly reduced launch and manufacturing costs. AMT techniques can be used to provide small features and thin substrates.

In accordance with one aspect of the concepts described herein, a low profile array (LPA) includes radiators, beamformers, circuit layers, and/or micro-strip layers that may be formed using additive manufacturing techniques in accordance with example embodiments of the invention. In embodiments, a radiator has a thickness in the range of about 0.020 inches (20 mils) provided using additive manufacturing technology (AMT) and thus may be referred to as an AMT radiator. A beamformer can include Faraday walls and be readily integrated with the radiator.

The disclosed LPA embodiments provide a phased array configured for space-based radar and related applications with small feature sizes and thin substrate materials, using Faraday walls, SNAP-RF connections between layers, printed vertical launch connections, and/or milled copper conductors. The overall array height can be confined to 41 mils (1,100 microns), for example, with the use of inventive milling and printing AMT techniques. Printed conductive Faraday walls confine electric fields and can be produced in the same manufacturing step as milling the other features. This saves significant labor costs which drive down the overall cost of the assembly. The design also utilizes the AMT capability to print conductive elements of virtually any shape and size, within machine constraints. These are used as tuning elements to achieve the desired performance for the low profile array. A custom printed connector interface can be used so that a standard BMB connector can be used to test the device.

One aspect of the present disclosure is directed to a low profile array (LPA) comprising an antenna element array layer having at least one Faraday wall, and a beamformer circuit layer coupled to the antenna element array layer. The beamformer circuit layer has at least one Faraday wall. The Faraday walls extends between ground planes associated with at least one of the antenna element array layer and the beamformer circuit layer.

Embodiments of the LPA further may include the LPA having a total thickness of less than about 47 mils. The antenna element array layer further may have a substrate, a conductor applied on the substrate, and a radiator is formed by removing conductive material and printing a conductor to create the radiator. The at least one Faraday wall of the antenna element array layer may be created by forming a trench that is back-filled with a conductive material. The at least one Faraday wall of the beamformer circuit layer may be created by forming a trench that is back-filled with a conductive material. The LPA further may include a vertical launch that extends through the radiator of antenna element array layer and the beamformer circuit layer. The vertical launch may be created by soldering pads on the radiator and the beamformer circuit layer prior to bonding so a solder bump is present on the surface of the beamformer circuit, drilling a center conductor hole, and filling the center conductor hole with copper. The LPA further may include a logic circuit layer disposed below the beamformer circuit layer. The LPA further may include a phase shift layer disposed below the logic circuit layer. The vertical launch may extend through the logic circuit layer and the phase shift layer. The vertical launch may extend extends through the logic circuit layer and the phase shift layer.

An array antenna includes a plurality of LPAs, with each LPA embodying the LPA described herein. The array antenna includes comprising four LPAs arranged such that the first set of tuning elements of an LPA and a first set of tuning elements of a second LPA are respectively adjacent to a second set of tuning elements of a third LPA and a second set of tuning elements of a fourth LPA.

Another aspect of the present disclosure is directed to a method of fabricating a low profile array (LPA). In one embodiment, the method comprises: milling trenches in a portion of an array having antenna elements and filling the trenches with a conductive material using additive manufacturing processing to form Faraday wall; and milling trenches in a beamformer substrate and filling the trenches with a conductive material using additive manufacturing processing to form Faraday walls.

Embodiments of the method further may include providing a vertical launch that extends through the radiator of antenna element array layer and the beamformer circuit layer. The vertical launch may be created by soldering pads on the radiator and the beamformer circuit layer prior to bonding so a solder bump is present on the surface of the beamformer circuit, drilling a center conductor hole, and filling the center conductor hole with copper. The LPA may include a logic circuit layer disposed below the beamformer circuit layer. The method further may include a phase shift layer disposed below the logic circuit layer. The vertical launch may extend through the logic circuit layer and the phase shift layer. The LPA may have a total thickness of less than about 47 mils. An antenna element array layer of the array may have a substrate, a conductor applied on the substrate, and a radiator is formed by removing conductive material and printing a conductor to create the radiator, the Faraday wall being created by forming a trench that is back-filled with a conductive material.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the disclosure. In the figures, each identical or nearly identical component that is illustrated in various figures may be represented by a like numeral. For purposes of clarity, not every component may be labeled in every figure. The foregoing features may be more fully understood from the following description of the drawings in which:

FIG. 4 is a chart showing example array components and illustrative thicknesses;

DETAILED DESCRIPTION

The concepts, systems and techniques described herein are directed toward a phased array provided using additive manufacturing technology so as to provide the phased array having a low profile, i.e., a thickness in the range of approximately 1 mm or less (referred to herein as a low profile phased array).

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, end, side, vertical and horizontal, and the like, are intended for convenience of description, not to limit the present systems and methods or their components to any one positional or spatial orientation.

Figure 1:
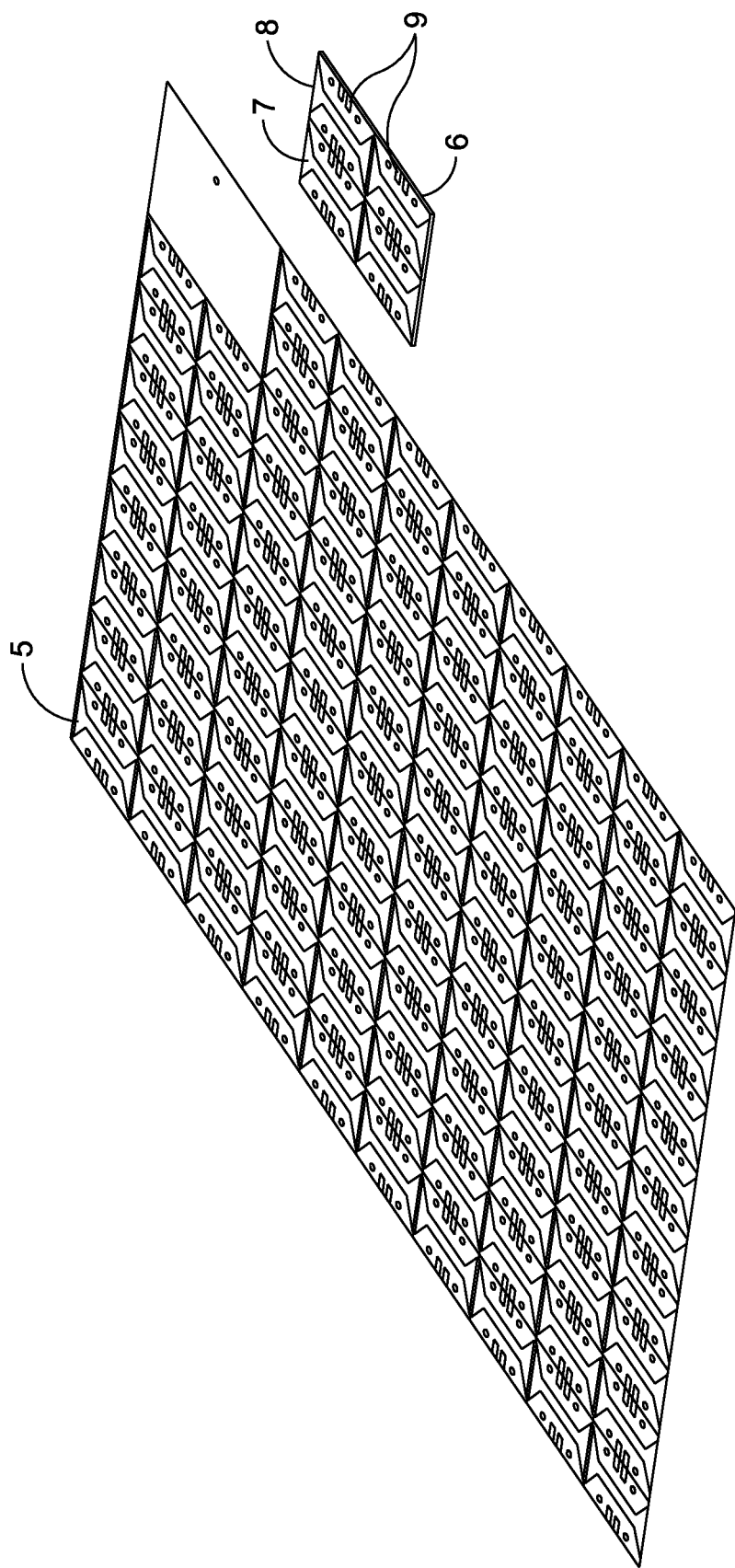
FIG. 1 is a perspective view of a low profile array having radiators, beamformers, circuit layers, and/or micro-strip layers that may be formed using additive manufacturing techniques in accordance with example embodiments of the disclosure.

FIG. 1 shows an example low profile array 5 having radiators, beamformers, circuit layers, and/or micro-strip layers that may be formed using additive manufacturing techniques in accordance with example embodiments of the invention. In the illustrated embodiment, a 2×2 subarray 7 is shown separated from the array 5. In embodiments, the array is built by combining line replaceable units (LRUs) comprising 64 elements that can be further divided into 16 mini-arrays, each having 4 elements. The array 5 includes a bottom ground plane 6, a top ground plane 8, with Faraday walls, each indicated at 9 extending between the ground planes 6, 8. The array 5 may be referred to herein as an antenna element array layer.

Figure 1A:
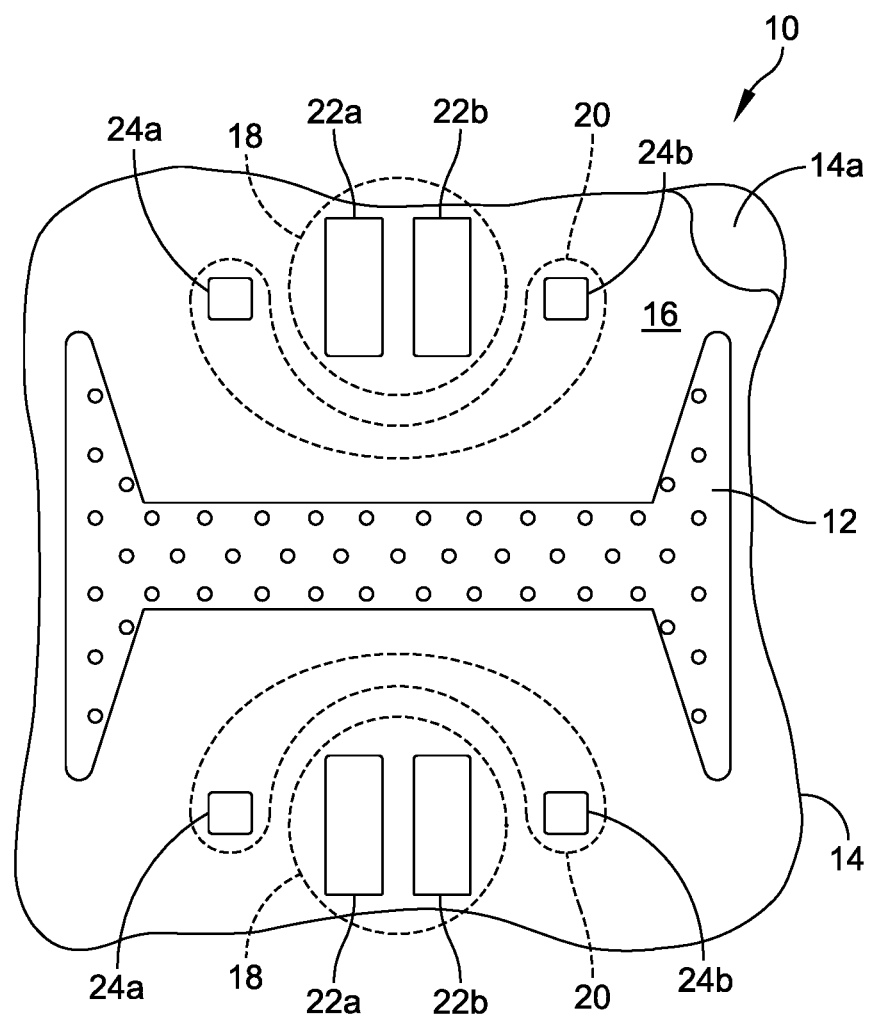
FIG. 1A is a top view of a bowtie antenna element manufactured using an additive manufacturing technology (AMT) manufacturing process.

FIG. 1A shows a bowtie antenna element 10 (or more simply antenna 10) manufactured using an additive manufacturing technology (AMT) manufacturing process including a radiator 12 (e.g., a slot aperture) having a general "bowtie" shape milled into a surface 14a of a dielectric substrate 14. Substrate surface 14a is provided having an electrically conductive material 16 (e.g., copper or an equivalent conductive material) disposed thereover (a portion of conductor 16 has here been removed to reveal a portion of dielectric substrate surface 14a). The bowtie shape radiator 12 is formed by an AMT milling operation which removes the conductive material 16 and then printing a conductor to form radiator 12. In some embodiments the conductive material 16 is provided as copper having a thickness of 0.007 inch. In this case, the slot aperture conductor would also be about 0.7 mils (18 microns) thick.

It should, of course, be appreciated that in other embodiments, other conductive materials and thicknesses may also be used. It is understood that the conductor thickness is selected to excite the bowtie radiator 12 in a desired manner. In embodiments, a thickness of the conductor is in the order of 0.005 mils.

Bowtie antenna element 10 further includes first and second sets of tuning elements 18, 20. The first set of tuning elements 18 includes a two pairs of conductors 22a, 22b with each conductor in the pair having a rectangular shape. The second set of tuning elements 20 includes a two pairs of conductors 24a, 24b with each conductor in the pair having a square shape. The conductors 22a, 22b and 24a, 24b may be referred to herein as Faraday walls or singularly as a Faraday wall. The tuning elements 22a, 22b, 24a, 24b are formed by an AMT milling operation which removes the conductive material 16 as well as substrate material 14 so as to form an opening in the substrate having the desired shape of the tuning element (here, pairs of rectangular and square shapes). A conductive ink (or more generally a conductive fluid) is then disposed in the openings to form the tuning elements 22a, 22b, 24a, 24b.

With this technique, an antenna element having a geometry which is relatively simple compared with geometries of prior art antenna elements having similar operational characteristics (e.g., frequencies of operation, bandwidth characteristics, gain characteristics, etc.) is provided.

The printed tuning elements can be of the shape or size needed to produce double tuned performance, e.g., creating resonances at two different frequencies. That is, two sets of tuning elements are used to produce a desired field configuration in a unit cell.

Figure 1B:
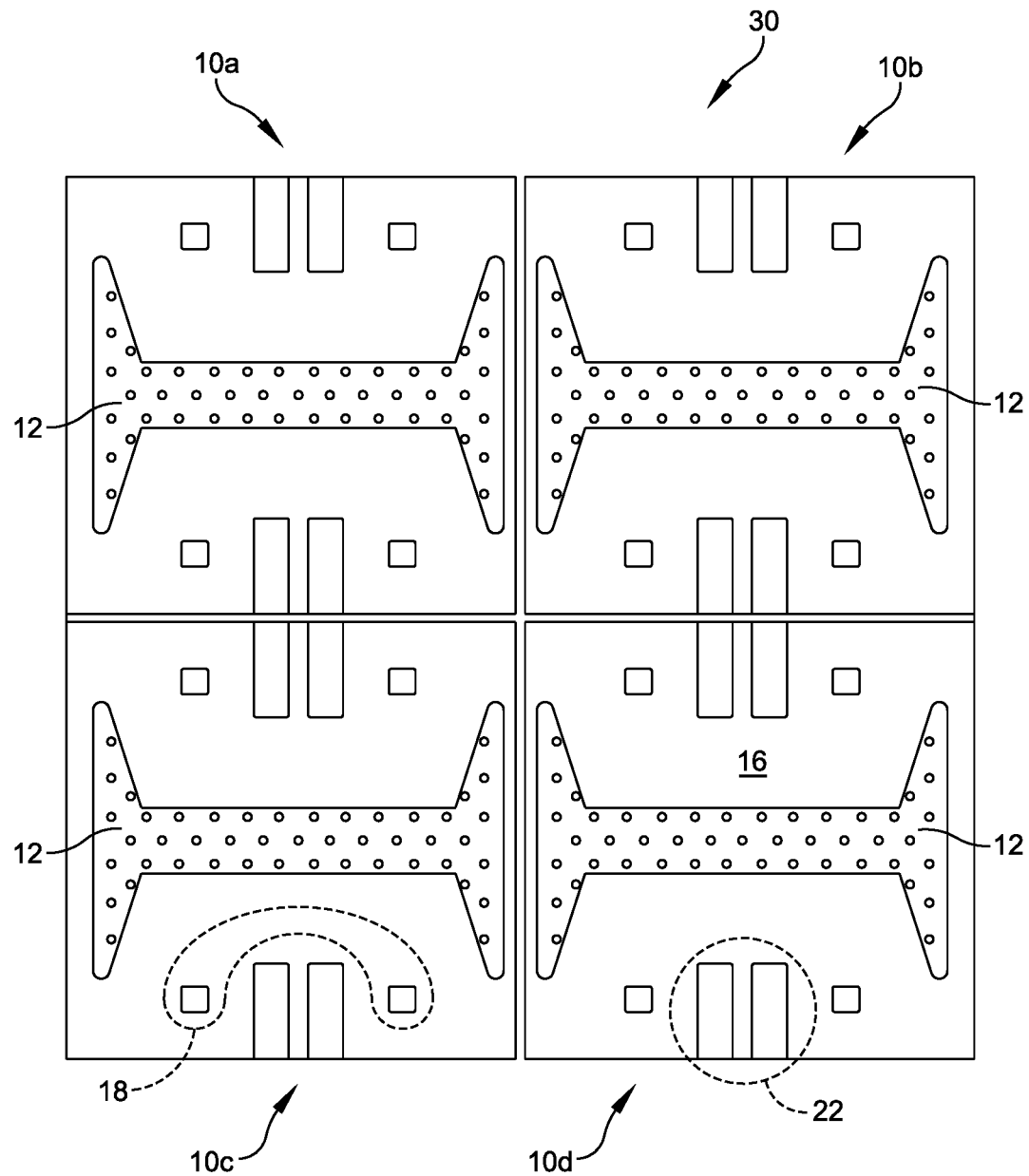
FIG. 1B is a top view of a plurality of bowtie radiators disposed form an array antenna.

Referring now to FIG. 1B, a plurality of bowtie radiators, are disposed form an array antenna 30. In the illustration of FIG. 1B, four bowtie radiators 10a-10d are disposed to form a 2×2 array. Those of ordinary skill in the art will appreciate, of course, that any size array may be formed. Array antenna 30 may form a building block with which to build relative large array antennas (e.g., array antennas comprising tens, hundreds or thousands of antenna elements depending upon the needs of a particular application). Thus, the antenna element design described above in conjunction with FIG. 1 can be integrated into full antenna arrays that can be printed and prototyped in short amount of time.

Figure 1C:
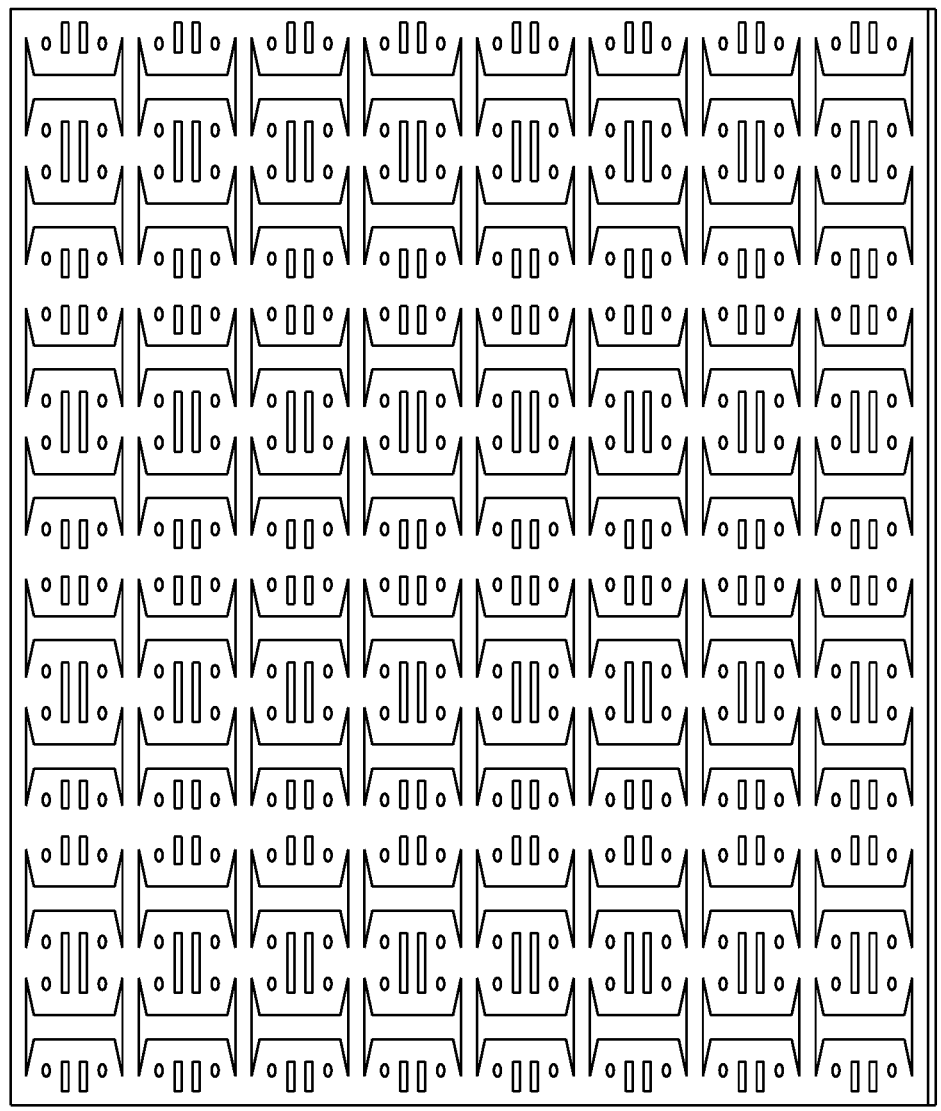
FIG. 1C is a perspective view of an example subarray portion shown during processing to create Faraday walls.

FIG. 1C is an example subarray portion shown during processing to create Faraday walls in the form of trenches that can be later back-filled with a conductive material, such as conductive ink, as shown and described above. In one embodiment, the Faraday wall extends between ground planes associated with substrate 14, e.g., a bottom ground plane and a top ground plane.

Figure 2:
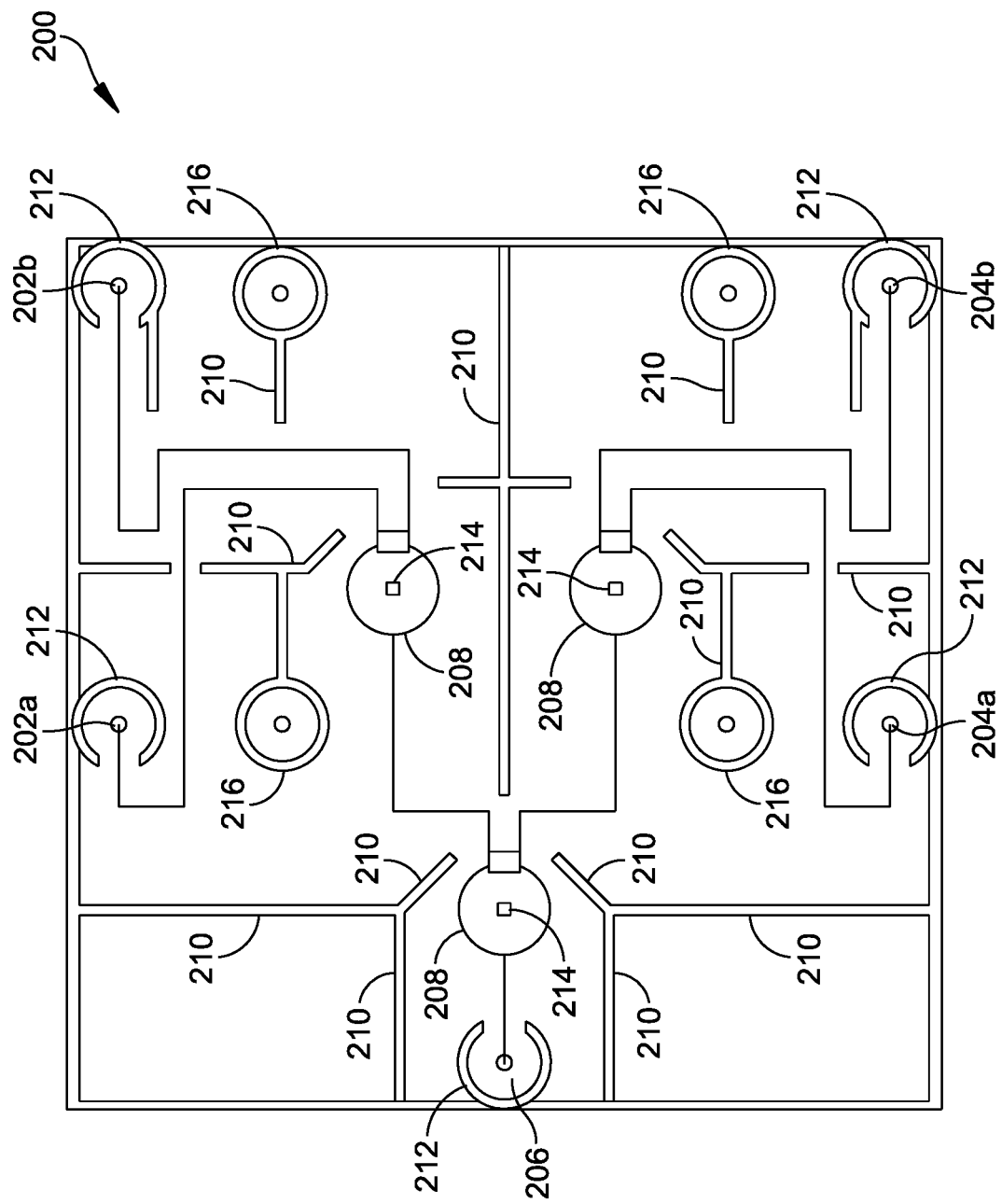
FIG. 2 is a top view of a beamformer that forms a portion of a low profile array.

FIG. 2 shows an example beamformer 200 that forms a portion of a low profile array. The beamformer 200 aggregates unit cell RF signals. In embodiments, the beamformer is configured as an RF division network that fits within a 10 mil subassembly, as described below. The beamformer 200 may also be referred to herein as a beamformer layer, which is applied to the antenna element array layer.

In embodiments, low profile array embodiments are provided as a single beam half-duplex X-Band phased array producing a single linear polarization, although dual polarization, multi-beam array architectures at various microwave frequencies are also practical applications of the described method. In one embodiment, unit cells fall into about a 0.6 in. square lattice, the dimensions of which control the integrated RF front-end components.

Antenna elements may be grouped together into a subarray and fed together in a phase-controlled manner to generate the beam characteristics of an antenna larger than that of any single antenna element. A beamformer can include a beam port and a plurality of element ports. In a transmit mode, the signal to be transmitted is applied to the beam port and is distributed by the beamformer to the various element ports. In the receive mode, the unguided electromagnetic signals received by the antenna elements and coupled in guided form to the element ports are combined to produce a beam signal at the beam port of the beamformer.

In the illustrated embodiment, beamformer 200 is provided as a 2×2:1 beamformer having a first pair of element ports shown as first and second element ports 200a,b and a second pair of element ports shown as third and fourth element ports 204a,b. The signals from the element ports are combined into a beam port 206. The beamformer includes several beamformer circuits, indicated at 208. As will be described more fully below, the beamformer 200 can include Faraday walls 210, 212, 214, 216 to enhance signal isolation. As shown, the Faraday walls 212 provide signal isolation to the beam port 206 and the Faraday walls 214 provide signal isolation to the beamformer circuits 208. As mentioned above, the Faraday wall can be configured to extend between ground planes associated with substrate, e.g., a bottom ground plane and a top ground plane.

Figure 2A:
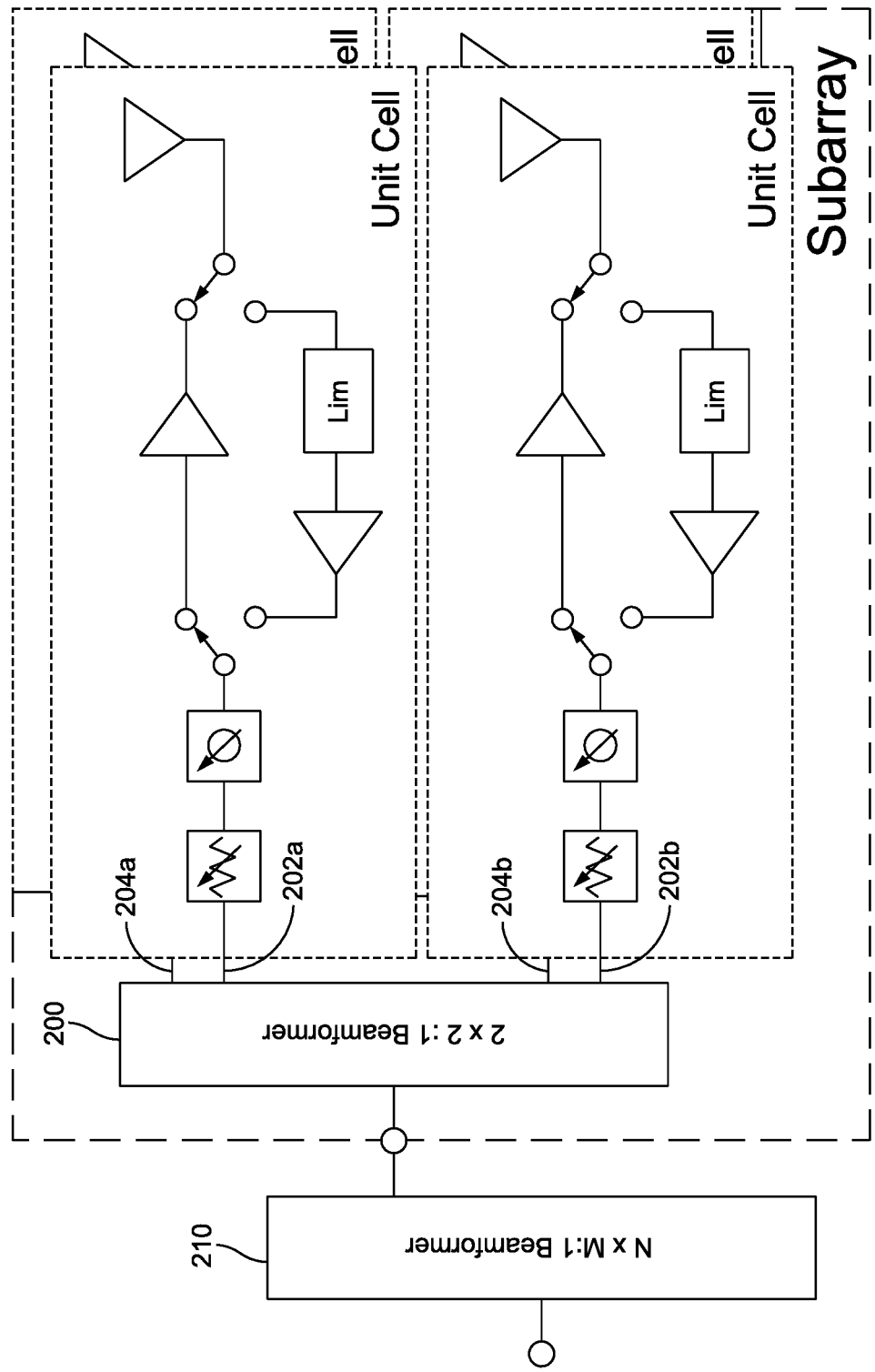
FIG. 2A is a schematic view of a subarray having pairs of unit cells that are coupled to a beamformer at ports.
Figure 2B:
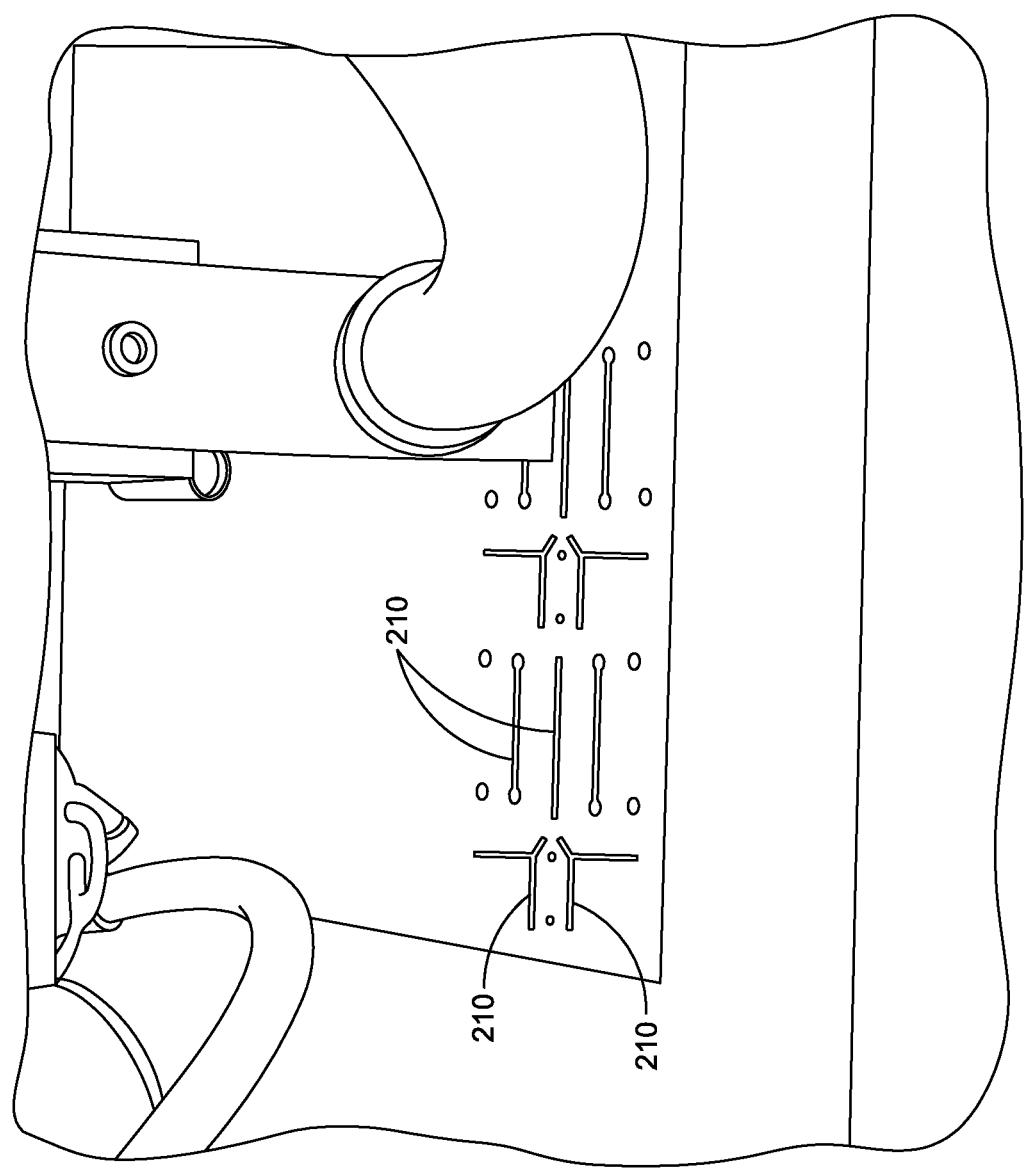
FIG. 2B is a perspective view showing the creation of a Faraday wall on a beamformer.

FIG. 2A shows an example subarray 220 having pairs of unit cells that are coupled to the beamformer 200 at ports 202a,b and 204a,b. The 2×2:1 beamformer 200 can be coupled to a N×M:1 beamformer 210 of any practical size. FIG. 2B shows Faraday wall creation for a beamformer.

Figure 3:
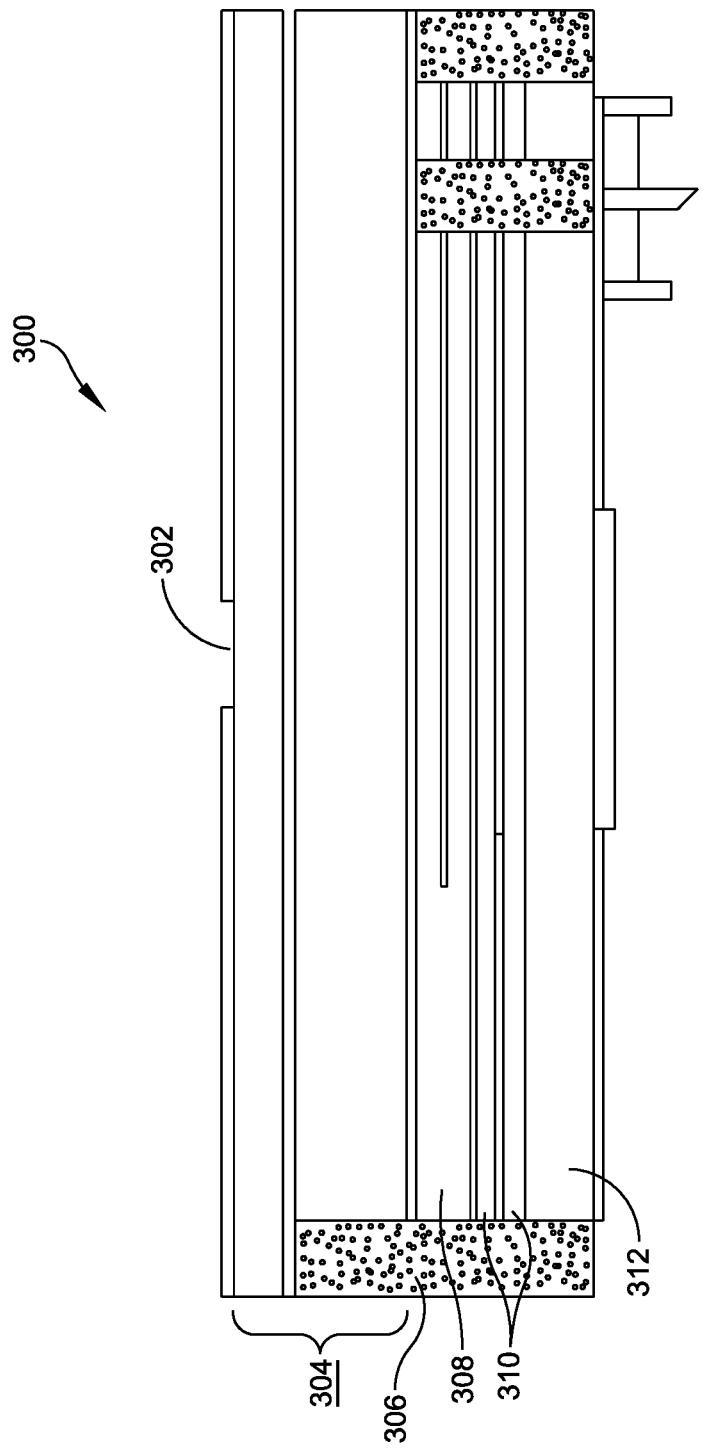
FIG. 3 is a cross-sectional view of a low profile array stack up.

FIG. 3 shows an example low profile array 300 stack up. In embodiments, the total thickness T of the array is less than about 47 mils (1.18 mm). In embodiments, the low profile array 300 includes a slot radiator 302, such as the radiator of FIG. 1A, coupled to a radiator feed circuit 304. A vertical launch 306 is coupled to the slot radiator 302.

A beamformer circuit layer 308, such as the beamformer circuit of FIG. 2, is coupled between the radiator feed circuit 304 and a DC and logic circuit layer 310. A phase shifter layer 312 can be coupled to the DC and logic circuit layer 310.

FIG. 4 is a tabular representation of example array components and illustrative thicknesses. As can be seen the total thickness of the low profile array is less than about 47 mils.

Figure 5C:
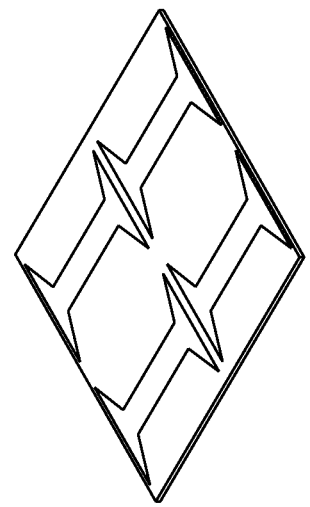
FIGS. 5A-5C illustrate a first portion of process steps for fabricating a low profile array in accordance with example embodiments of the disclosure.
Figure 5B:
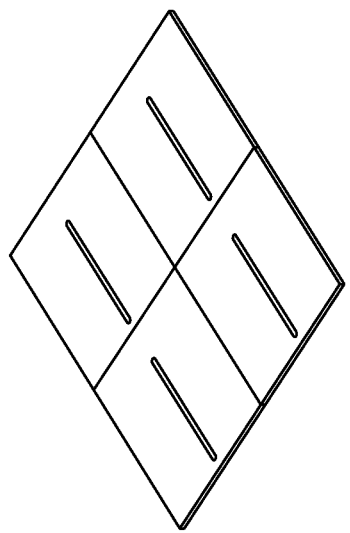
Figure 5A:
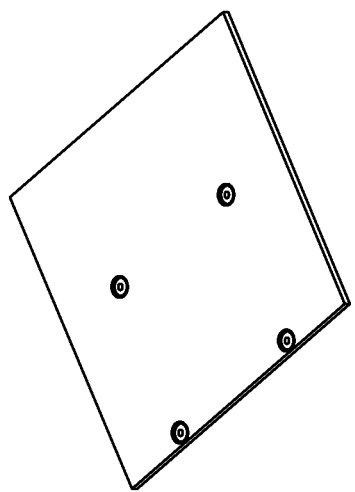

FIGS. 5A-5C show a first portion of process steps for fabricating a low profile array in accordance with example embodiments of the invention. Radiator fabrication includes a 4 element layer in FIG. 5A, a feed layer in FIG. 5B, and ground plane clearance in FIG. 5C.

Figure 6C:
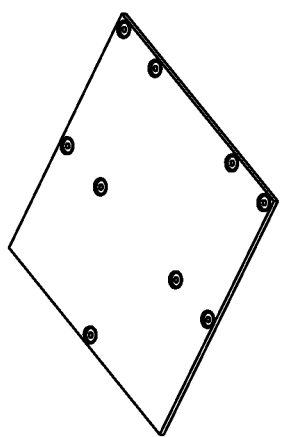
FIGS. 6A-6C illustrate a second portion of process steps for fabricating a low profile array.
Figure 6B:
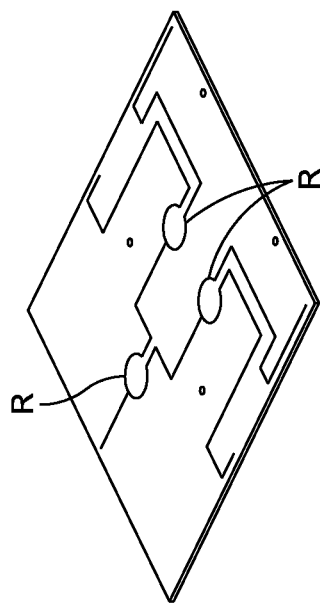
Figure 6A:
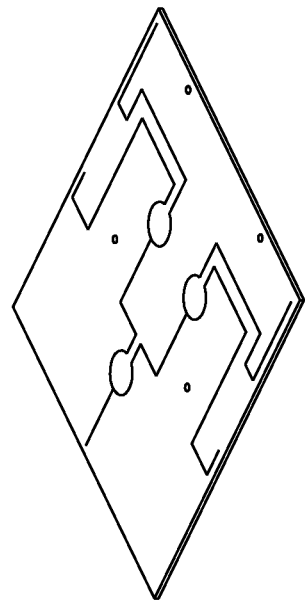

FIGS. 6A-6C shows a second portion of processing steps for fabricating a low profile array including a beamformer layer in FIG. 6A, resistor (shown as R) dispensing on the beamformer layer in FIG. 6B, and ground plane clearance in FIG. 6C.

Figure 7C:
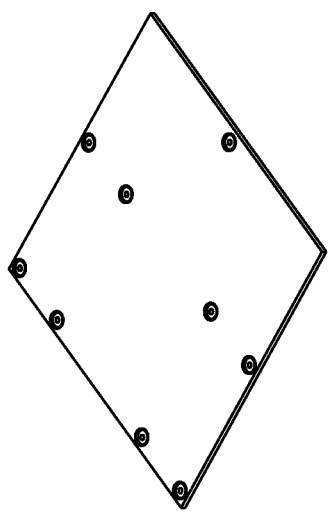
FIGS. 7A-7C illustrate a first bond cycle.
Figure 7B:
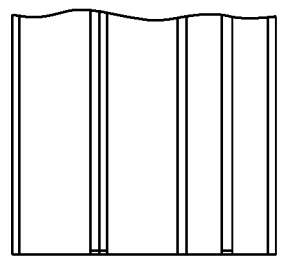
Figure 7A:
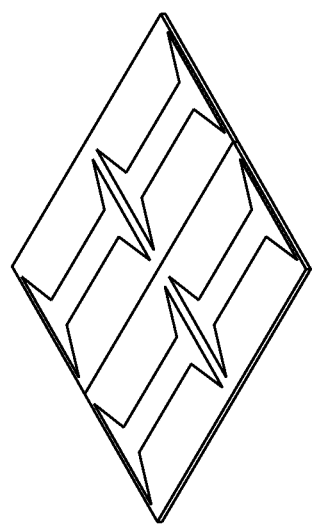

A first bond cycle is shown in FIGS. 7A-7C. FIG. 7A shows a top view of a first bonding stack up and FIG. 7B shows a side view of the first bonding stack up with a radiator slot and radiator feed with a bond film. The stack up further includes a radiator ground plane, bond film, beamformer trace layer and bond film and a beamformer ground plane in FIG. 7C.

Figure 8C:
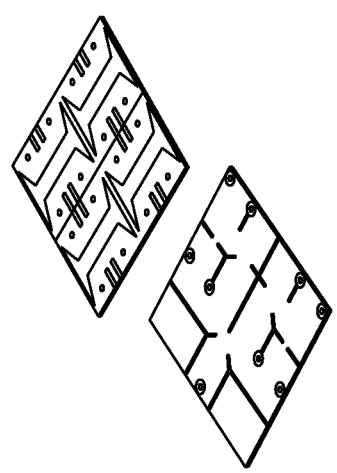
FIGS. 8A-8C shows Faraday walls milled in the radiator and in the beamformer.
Figure 8B:
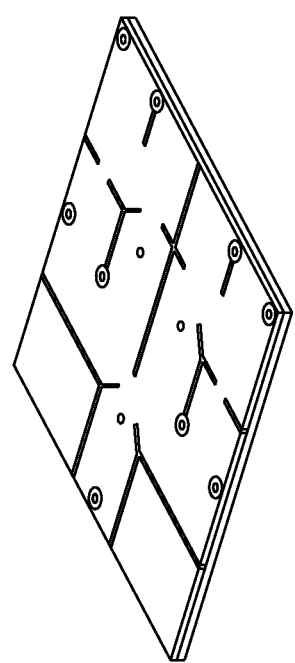
Figure 8A:
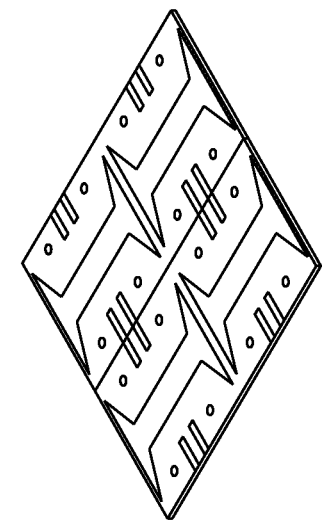

FIGS. 8A-8C shows Faraday walls milled in the radiator FIG. 8A and in the beamformer FIG. 8B. In embodiments, trenches are formed down to a ground plane. FIG. 8C shows the trenches in the radiator and beamformer filled with a conductive material, such as a conductive ink using AMT techniques.

Figure 9:
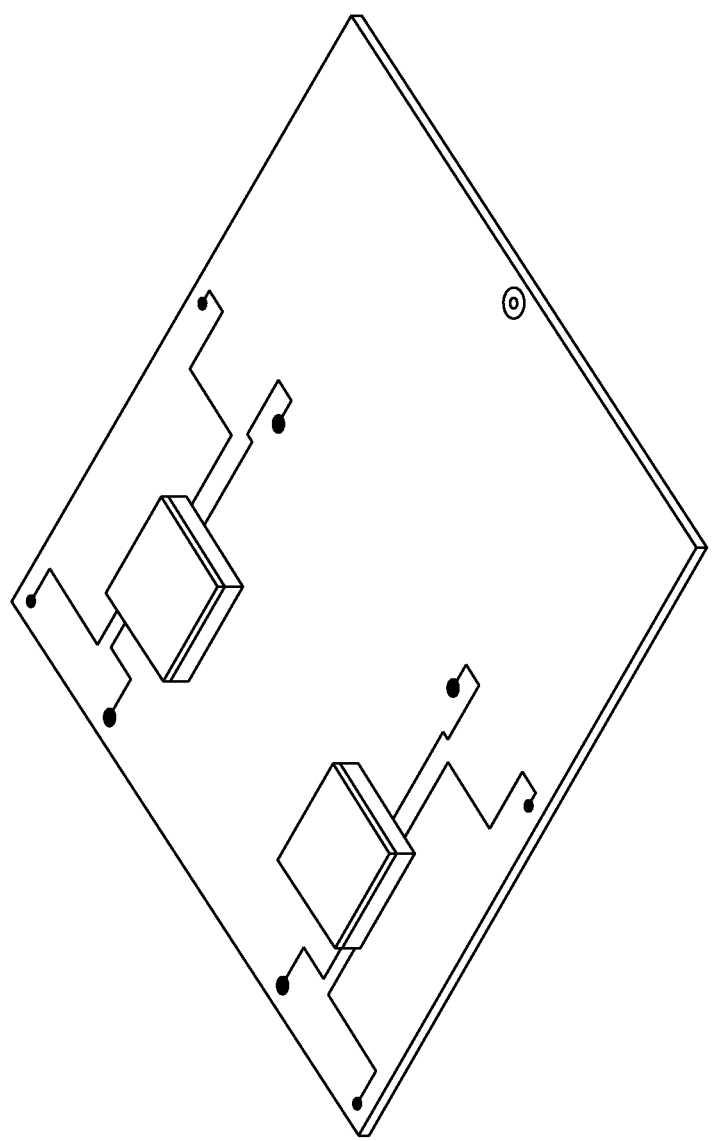
FIG. 9 is a perspective view of an active micro-strip layer.

FIG. 9 shows machining of an active micro-strip layer. IC are shown on the micro-strip layer.

Figure 10B:
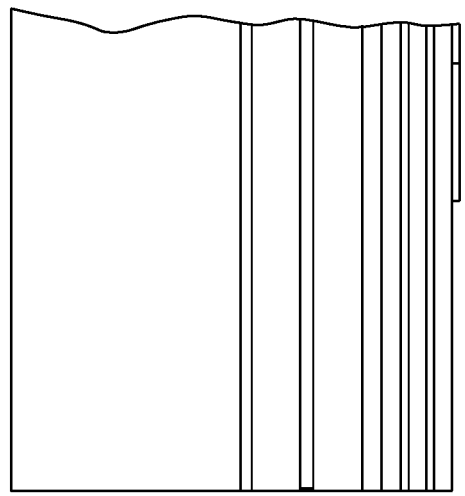
FIG. 10B is a cross-sectional view of a stack up after a second bonding cycle.
Figure 10A:
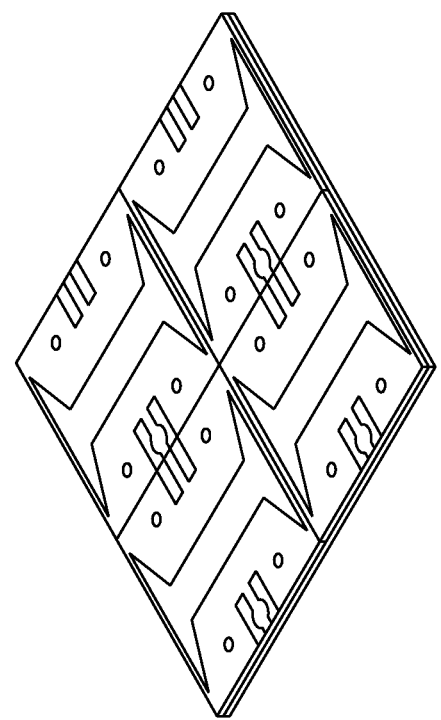
FIG. 10A is a perspective view of a final bonded assembly.

FIG. 10A shows a final bonded assembly and FIG. 10B shows the stack up after the second bonding cycle. The radiator/beamformer corresponds to the stack up of FIG. 7B to which bond film is added, a DC layer, bond film, logic layer, bond film and active microstrip layer.

Figure 11A:
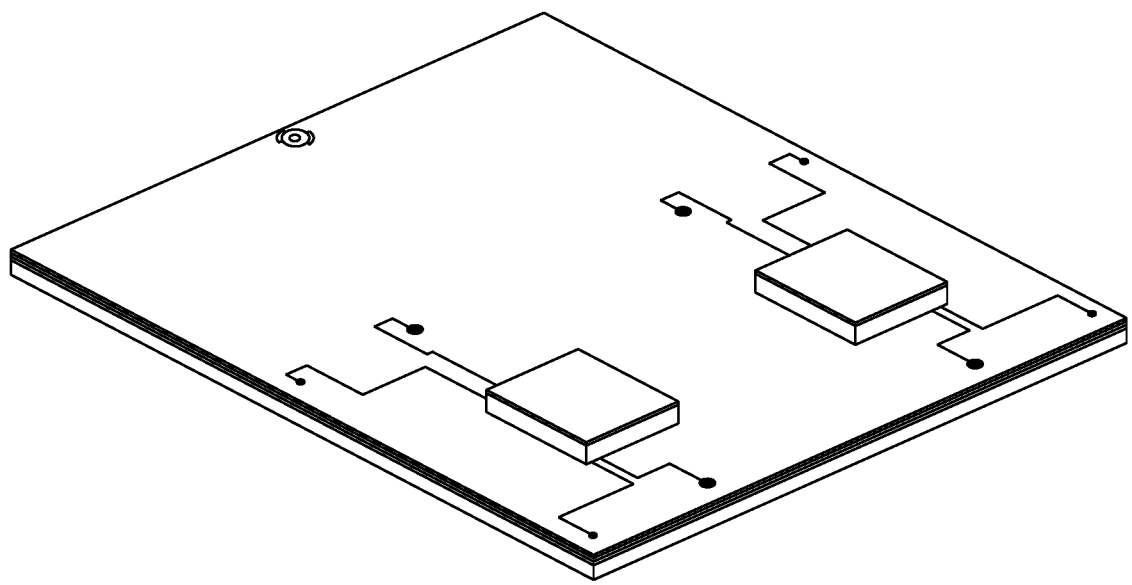
FIG. 11A is a perspective view of center conductors formed in an active microstrip layer.
Figure 11B:
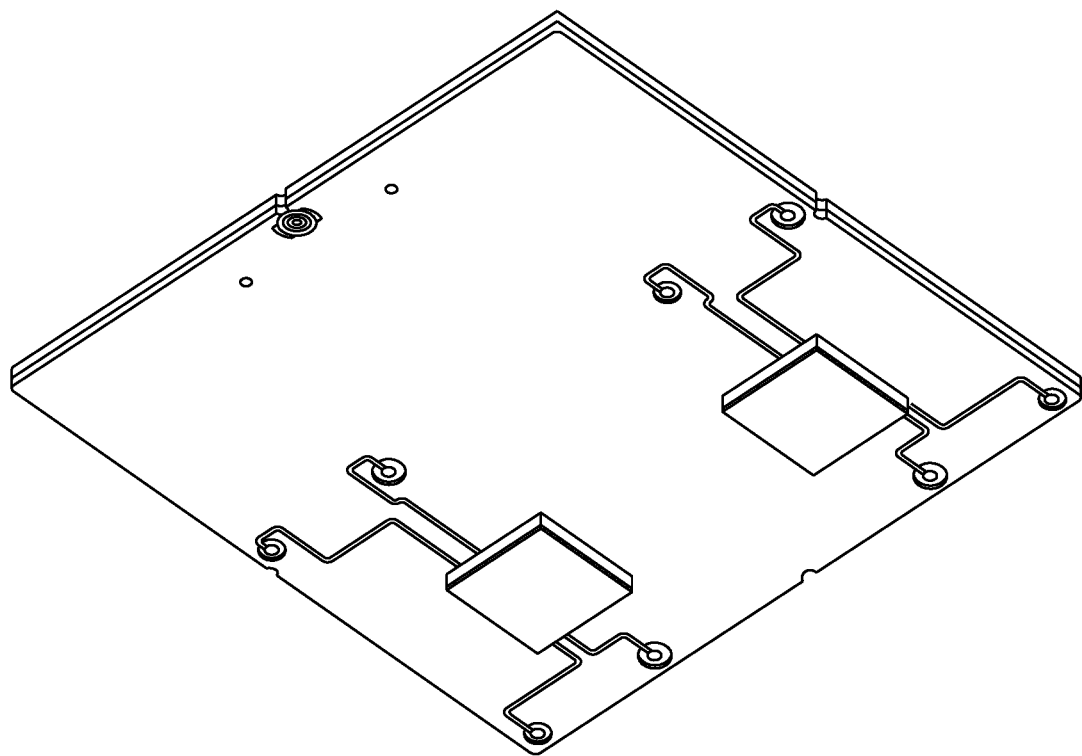
FIG. 11B is a perspective view of Faraday walls after drilling and filling with conductive ink.

FIG. 11A shows center conductors formed in the active microstrip layer and FIG. 11B shows Faraday walls after drilling and filling with conductive ink, for example.

Figure 12:
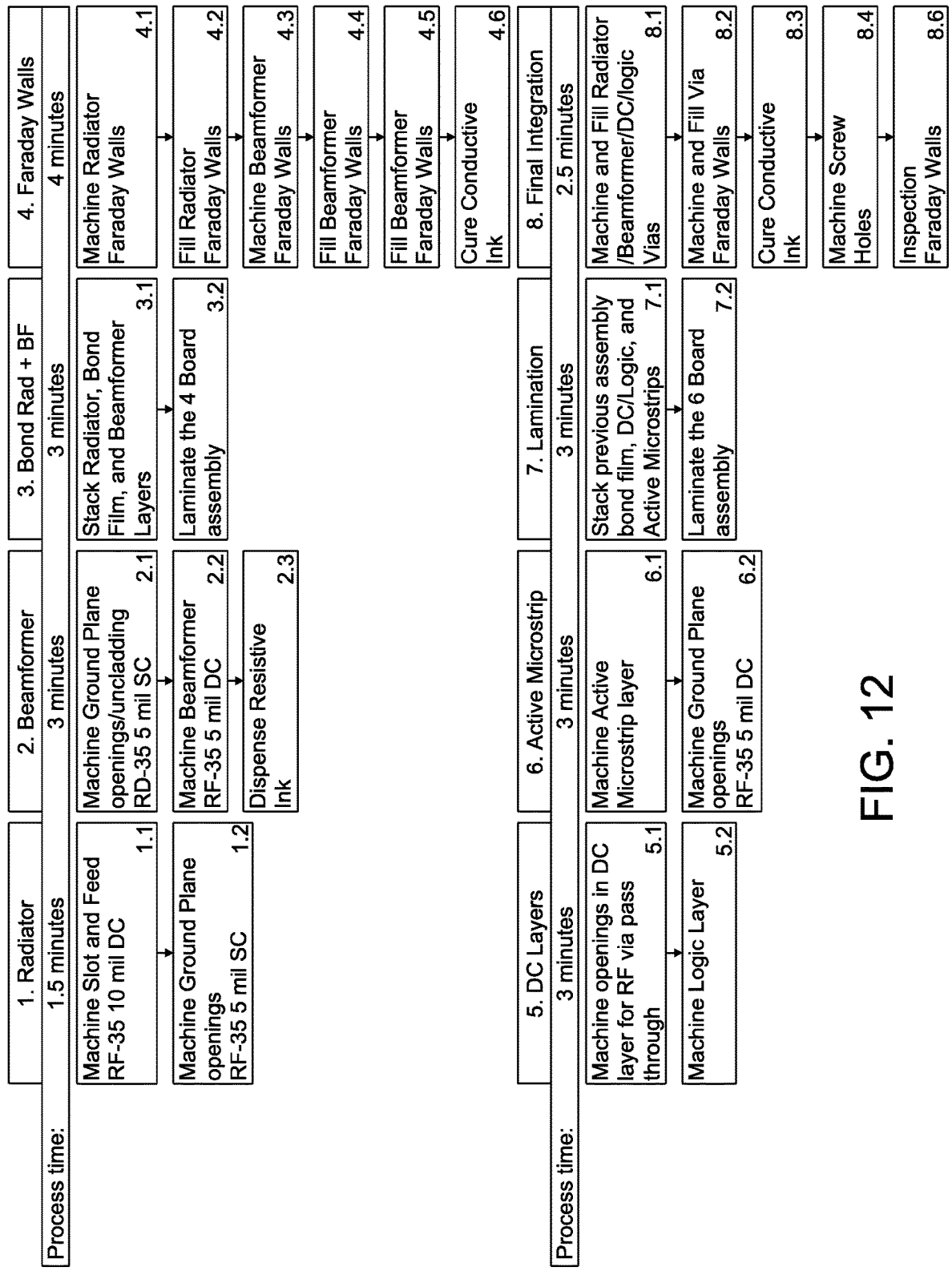
FIG. 12 is a process flow diagram.

FIG. 12 shows an example process flow diagram with steps represented as per unit cell except for the beamformer which is represented as per mini array. In the example build, there were 64 unit cells, equating to about 20.75 hours of machine use time to manufacture 64 elements. One other aspect of the process flow diagram is the time to create Faraday walls. As shown, the process time counts 2 milling and filling operations of the Faraday walls.

Faraday Walls:

Faraday walls replace ground vias and provide even better EMI shielding for adjacent microwave circuits and higher-order mode suppression. Instead of drilling through the entire assembly and electroplating, a trench is created from one ground plane to another then backfilled with conductive ink. For the radiator, as shown and described above, the response is tuned by providing a block of conductive material. These blocks of conductive material serve to double-tune the radiator providing increased bandwidth within the operating frequency range. The beamformer Faraday walls attenuate the higher order modes present in the beamformer layer more effectively than conventional ground vias because they are continuous, and so eliminate the periodic effects and the electrical leakage of a via fence. Faraday walls provide EMI shielding techniques and perform without the need for an electroplating process.

In one embodiment, the Faraday wall is a conductor providing an electromagnetic boundary "vertically" through the substrates. As described herein, the Faraday wall may be formed by machining a trench through the substrates down to a ground plane and filling the trench with a conductive material, such as a conductive ink applied with additive manufacturing techniques. The conductive ink, when set, may form a substantially electrically continuous conductor. The trench in which the Faraday wall is formed does not have to pierce or go through the ground plane. The Faraday wall may therefore be in electrical contact with the ground plane. Additionally, a top of the Faraday wall may be in electrical contact with another ground plane, which may be accomplished by slight over-filling of the machined trench to ensure contact between the conductive ink and the ground plane and/or by application of solder, for example. Positioning of the Faraday wall may be selected for its influence on signal(s) conveyed by the feed circuit. In various embodiments, a Faraday wall may be positioned to provide isolation without regard to influencing a signal in any particular way other than to provide the isolation.

Copper Vertical Launch:

While Faraday walls remove electroplating from the shielding techniques, a new method to remove electroplating from the vias (center conductors) is provided in order to connect layers together with blind vias easily. These provide a Transverse Electro-Magnetic (TEM) coaxial interface between different layers of stripline and microstrip circuits in a multi-layer Printed Circuit Board (PCB). In order to do this, the pads on the beamformer and radiator layers are pre-tinned (soldered) before bonding so a solder bump is present on the surface of the trace. During subsequent milling operations, these center conductor holes are drilled and filled with a copper center conductor using soldering processes. As the soldering iron is used to connect the center conductor to the top trace on the active micro-strip layer, heat is conducted down the length of the center conductor to the layer underneath, reflowing the pre-deposited solder bump. This solder bump does reflow during bonding, but does not migrate throughout the assembly because of a pre-drilled hole in the boards above the solder bump. Post processing after bonding includes milling down to the solder bump, inserting the copper center conductor, and reflowing the center conductor to both traces. This creates an effective solution that is inexpensive, fast, does not require electroplating, and is easily automatable. This method could be extended in the future to insert the center conductor before bonding of the assembly, allowing the center conductor connections to be made during the bonding process.

Small Feature Size Processing:

Many of the trace widths throughout the LPA array are below 5 mil (thousands of an inch). Traditional PCB houses that etch boards generally can safely create PCBs with line widths above 5 mils, or will require additional money or time to get below that limit. For a rapid prototyping architecture that is counterproductive. The team has been able to take the capabilities at the Raytheon UMass Lowell Research Institute (RURI) and use them to create copper traces of 2.7 mil (~70 microns). An accurate CNC machine has a very accurate gantry system, which allows these very small traces to be milled with acceptable edge properties. Resistive ink can be dispensed very accurately with Nordson Pro4 system, for example, to make resistors inside of these small traces. Finally, the Faraday wall assemblies need not be screen printed, as they are dispensed easily with the use of the Pro4 Machine and Pico-Pulse stand-off dispenser. The combination of small feature size processing with accurate dispensing enables the creation of cutting edge assemblies that push the limits of current technology, all while providing a rapid prototyping solution to decrease time to market.

Traditional PCB Process Vs. Embodiments Using AMT Processing:

The traditional PCB process has successfully introduced changes over the last 15 to 20 years resulting in substantial recurring cost reductions. Major design methods have not changed very much as ground vias are still used to create EMI shielding, center conductors are used to connect layers together, and RF PCBs take a significant amount of time to prototype. It can take 3 to 5 months from when a prototype is requested from an outside board house to when it arrives ready for test at one of our sites. Below is a table comparing significant aspects of the traditional vs. AMT prototyping method:

| Metric: | Traditional: | AMT: |
|---|---|---|
| Line Isolation/ TEM Mode Propagation Ground Vias/ Faraday Walls | Electroplated Vias Increased engineering time because of interaction between vias Electrical leakage at higher frequencies Vias are drilled through the entire RF PCB to allow for effective electroplating | Faraday Walls Decreased engineering time due to inconsequential interaction between microwave circuits Excellent electrical performance at microwave and millimeter wave frequencies, providing about −80 dB of isolation Walls are milled from one ground plane to another, not through the entire board. |

| Metric: | Traditional: | AMT: |
| --- | --- | --- |
| PCB Coaxial Center Conductor | Electroplated Vias<br>Vias are drilled through the entire board, electroplated, then back drilled to remove copper in areas where it is not required<br>Process is increasingly difficult with blind vias, requiring precision milling to ensure the drill stops at each center conductor pad<br>Before electroplating via holes must be thoroughly cleaned to ensure no residue impacts the plating of the copper. | Copper Vertical Launch<br>Blind vias are easily created by pre-tinning the bottom pads<br>Insertion of a copper center conductor is easily automatable<br>Solder reflows on both layers with a touch of the soldering iron to the top layer<br>Removes electrodepositing of copper from the center conductor process |
| Trace Conductors | Minimum Line Width: 5 mil, expensive cost to 3 mil | Minimum Line Width: 2.7 mil, path of development to 2 mil |
| Array Building Blocks/ Interconnections | Conventional RF Connectors<br>Bulky, expensive connectors that need to be solder reflowed to the board<br>Arrays need to be made in large panels so if one connectors or chip is not working the entire panel may need to be scraped<br>Adds weight, cost, and complexity to an already difficult assembly | SNAP-RF<br>Allows board to board interconnections with a low profile connector that is made from on board features<br>Arrays can be built by utilizing tiny building blocks<br>If one building block fails, it can be replaced with another working block<br>Spreads out risk to make sure the building block works before integrated to the array |
| Prototype Build Cycle | 3-5 months | 3 weeks (Currently)<br>Overnight (Potential) |

Inventive AMT methods push the technology boundaries because of the need for smaller feature sizes than traditional etching techniques. In order to meet the requirements for LPA embodiments, reliable creation of 2.7 mil traces is desired. In embodiments, we accomplish this by milling on the accurate CNC machine.

Having described preferred embodiments, which serve to illustrate various concepts, structures and techniques, which are the subject of this patent, it will now become apparent to those of ordinary skill in the art that other embodiments incorporating these concepts, structures and techniques may be used. Additionally, elements of different embodiments described herein may be combined to form other embodiments not specifically set forth above.

Accordingly, it is submitted that that scope of the patent should not be limited to the described embodiments but rather should be limited only by the spirit and scope of the following claims.

What is claimed is:

1. An array antenna comprising:
a plurality of low profile arrays (LPAs), each LPA including
an antenna element array layer having at least one Faraday wall, and
a beamformer circuit layer coupled to the antenna element array layer, the beamformer circuit layer having at least one Faraday wall, wherein the Faraday walls extend between ground planes associated with at least one of the antenna element array layer and the beamformer circuit layer,
wherein four LPAs arranged such that a first set of tuning elements of a first LPA and a first set of tuning elements of a second LPA are respectively adjacent to a second set of tuning elements of a third LPA and a second set of tuning elements of a fourth LPA.

2. The array antenna according to claim 1, wherein the LPA has a total thickness of less than about 47 mils.

3. The array antenna according to claim 1, wherein the antenna element array layer further has a substrate, a conductor applied on the substrate, and a radiator is formed by removing conductive material and printing a conductor to create the radiator.

4. The array antenna according to claim 3, wherein the at least one Faraday wall of the antenna element array layer is created by forming a trench that is back-filled with a conductive material.

5. The array antenna according to claim 3, wherein the at least one Faraday wall of the beamformer circuit layer is created by forming a trench that is back-filled with a conductive material.

6. The array antenna according to claim 3, further comprising a vertical launch that extends through the radiator of antenna element array layer and the beamformer circuit layer.

7. The array antenna according to claim 6, wherein the vertical launch is created by soldering pads on the radiator and the beamformer circuit layer prior to bonding so a solder bump is present on the surface of the beamformer circuit, drilling a center conductor hole, and filling the center conductor hole with copper.

8. The array antenna according to claim 6, further comprising a logic circuit layer disposed below the beamformer circuit layer.

9. The array antenna according to claim 8, further comprising a phase shift layer disposed below the logic circuit layer.

10. The array antenna according to claim 9, wherein the vertical launch extends through the logic circuit layer and the phase shift layer.

* * * * *